United States Patent
Chen et al.

(10) Patent No.: US 9,406,500 B2
(45) Date of Patent: Aug. 2, 2016

(54) FLUX RESIDUE CLEANING SYSTEM AND METHOD

(75) Inventors: I-Ting Chen, Hsin-Chu (TW); Ying-Ching Shih, Taipei (TW); Szu Wei Lu, Hsin-Chu (TW); Jing-Cheng Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 331 days.

(21) Appl. No.: 13/369,138

(22) Filed: Feb. 8, 2012

(65) Prior Publication Data
US 2013/0199577 A1 Aug. 8, 2013

(51) Int. Cl.
| H01L 21/02 | (2006.01) |
| H01L 21/67 | (2006.01) |
| H01L 21/48 | (2006.01) |
| H01L 23/00 | (2006.01) |

(52) U.S. Cl.
CPC ...... *H01L 21/02041* (2013.01); *H01L 21/4864* (2013.01); *H01L 21/67028* (2013.01); *H01L 24/81* (2013.01); *H01L 2224/16225* (2013.01); *H01L 2224/16227* (2013.01); *H01L 2224/32225* (2013.01); *H01L 2224/73204* (2013.01); *H01L 2224/81815* (2013.01); *H01L 2224/81911* (2013.01); *H01L 2924/07802* (2013.01)

(58) Field of Classification Search
USPC ..................... 134/61, 63, 84, 88, 89
See application file for complete search history.

(56) References Cited

U.S. PATENT DOCUMENTS

| | | | | |
|---|---|---|---|---|
| 4,017,343 | A | * | 4/1977 | Haas ............................. 216/93 |
| 4,811,082 | A | | 3/1989 | Jacobs et al. |
| 4,990,462 | A | | 2/1991 | Sliwa, Jr. |
| 5,075,253 | A | | 12/1991 | Sliwa, Jr. |
| 5,380,681 | A | | 1/1995 | Hsu |
| 5,481,133 | A | | 1/1996 | Hsu |
| 5,538,024 | A | * | 7/1996 | Inada et al. .................... 134/60 |
| 5,635,053 | A | * | 6/1997 | Aoki et al. .................. 205/746 |
| 6,002,177 | A | | 12/1999 | Gaynes et al. |
| 6,187,678 | B1 | | 2/2001 | Gaynes et al. |
| 6,229,216 | B1 | | 5/2001 | Ma et al. |
| 6,236,115 | B1 | | 5/2001 | Gaynes et al. |
| 6,271,059 | B1 | | 8/2001 | Bertin et al. |
| 6,279,815 | B1 | | 8/2001 | Correia et al. |
| 6,355,501 | B1 | | 3/2002 | Fung et al. |
| 6,434,016 | B2 | | 8/2002 | Zeng et al. |
| 6,448,661 | B1 | | 9/2002 | Kim et al. |
| 6,461,895 | B1 | | 10/2002 | Liang et al. |
| 6,562,653 | B1 | | 5/2003 | Ma et al. |
| 6,570,248 | B1 | | 5/2003 | Ahn et al. |
| 6,600,222 | B1 | | 7/2003 | Levardo |

(Continued)

*Primary Examiner* — David Cormier
(74) *Attorney, Agent, or Firm* — Slater Matsil, LLP

(57) ABSTRACT

A flux residue cleaning system includes first and second immersion chambers, first and second spray chambers, and a drying chamber. The first immersion chamber softens an outer region of a flux residue formed around microbumps interposed between a wafer and a die when the wafer is immersed in a first chemical. The first spray chamber removes the outer region of the flux residue when the wafer is impinged upon by a first chemical spray in order to expose an inner region of the flux residue. The second immersion chamber softens the inner region of the flux residue when the wafer is immersed in a second chemical. The second spray chamber removes the inner region of the flux residue when the wafer is impinged upon by a second chemical spray in order to clean the wafer to a predetermined standard. The drying chamber dries the wafer.

20 Claims, 4 Drawing Sheets

(56) References Cited

U.S. PATENT DOCUMENTS

| | | |
|---|---|---|
| 6,607,938 B2 | 8/2003 | Kwon et al. |
| 6,661,085 B2 | 12/2003 | Kellar et al. |
| 6,762,076 B2 | 7/2004 | Kim et al. |
| 6,790,748 B2 | 9/2004 | Kim et al. |
| 6,887,769 B2 | 5/2005 | Kellar et al. |
| 6,908,565 B2 | 6/2005 | Kim et al. |
| 6,908,785 B2 | 6/2005 | Kim |
| 6,924,551 B2 | 8/2005 | Rumer et al. |
| 6,943,067 B2 | 9/2005 | Greenlaw |
| 6,946,384 B2 | 9/2005 | Kloster et al. |
| 6,975,016 B2 | 12/2005 | Kellar et al. |
| 7,037,804 B2 | 5/2006 | Kellar et al. |
| 7,056,807 B2 | 6/2006 | Kellar et al. |
| 7,087,538 B2 | 8/2006 | Staines et al. |
| 7,151,009 B2 | 12/2006 | Kim et al. |
| 7,157,787 B2 | 1/2007 | Kim et al. |
| 7,215,033 B2 | 5/2007 | Lee et al. |
| 7,276,799 B2 | 10/2007 | Lee et al. |
| 7,279,795 B2 | 10/2007 | Periaman et al. |
| 7,307,005 B2 | 12/2007 | Kobrinsky et al. |
| 7,317,256 B2 | 1/2008 | Williams et al. |
| 7,320,928 B2 | 1/2008 | Kloster et al. |
| 7,345,350 B2 | 3/2008 | Sinha |
| 7,402,442 B2 | 7/2008 | Condorelli et al. |
| 7,402,515 B2 | 7/2008 | Arana et al. |
| 7,410,884 B2 | 8/2008 | Ramanathan et al. |
| 7,432,592 B2 | 10/2008 | Shi et al. |
| 7,494,845 B2 | 2/2009 | Hwang et al. |
| 7,528,494 B2 | 5/2009 | Furukawa et al. |
| 7,531,890 B2 | 5/2009 | Kim |
| 7,557,597 B2 | 7/2009 | Anderson et al. |
| 7,576,435 B2 | 8/2009 | Chao |
| 7,834,450 B2 | 11/2010 | Kang |

\* cited by examiner

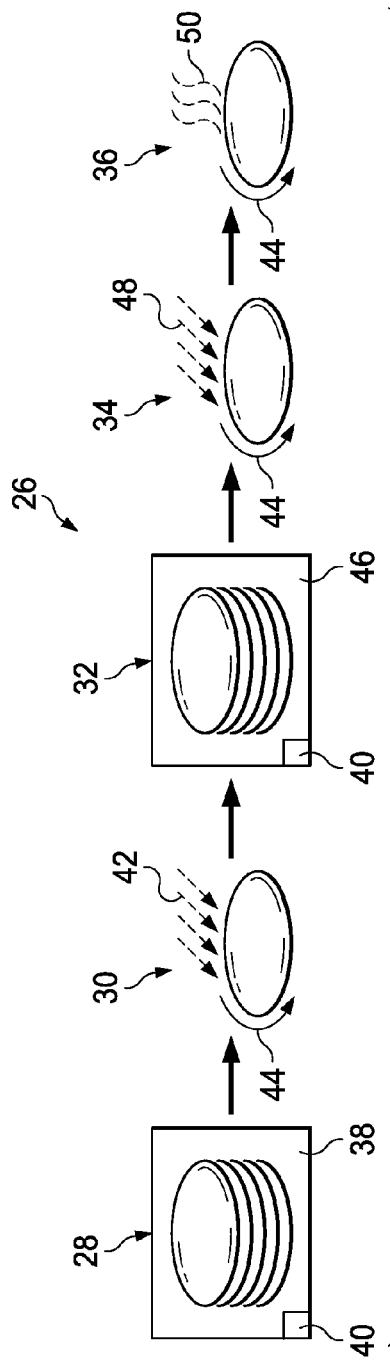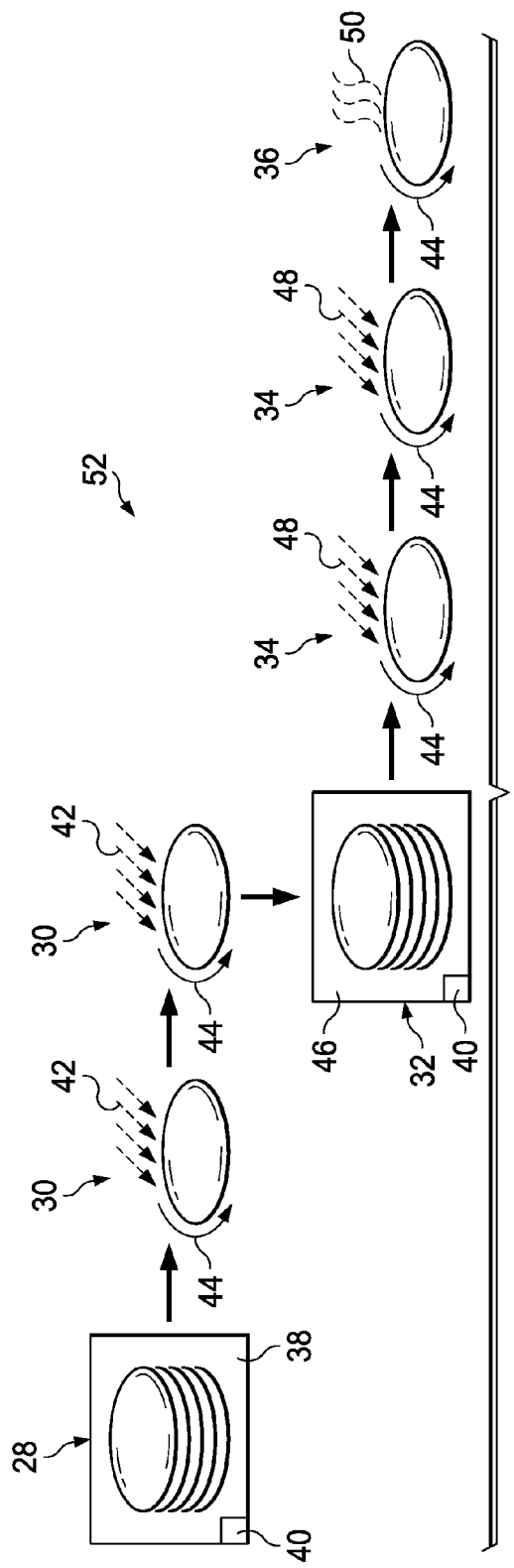

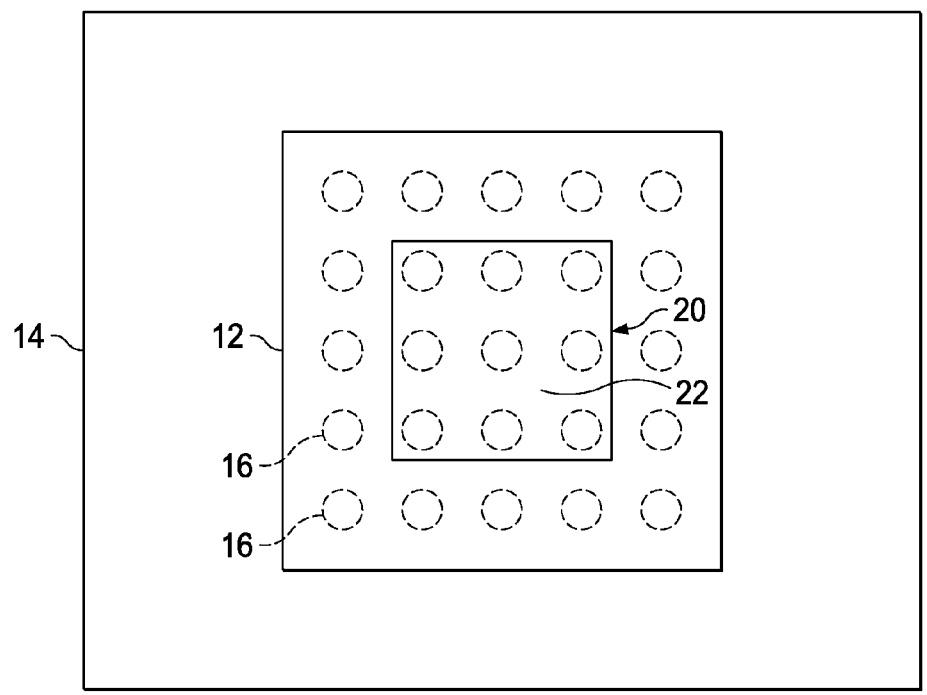
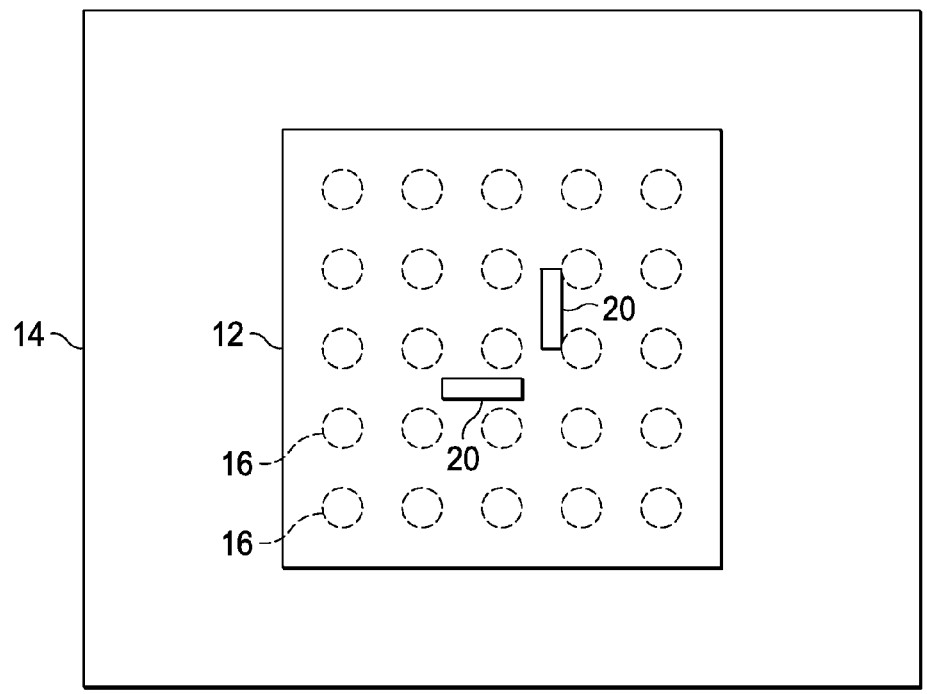

FLUX RESIDUE CLEANING SYSTEM AND METHOD

BACKGROUND

Flip chip microelectronic assembly is the direct electrical connection of face-down (hence, "flipped") electronic components onto substrates, circuit boards, another chip, wafer or carriers using conductive solder bumps on the chip bond pads.

In a typical flip chip assembly process, integrated circuits are created on a wafer. Thereafter, pads on a top surface of the integrated circuits are metalized. Next, conductive solder balls (i.e., dots or bumps) are deposited on the pads and the integrated circuits on the wafer are separated or cut from each other. Thereafter, each integrated circuit is "flipped" over and positioned so that the solder balls of the integrated circuit are aligned with mating connectors on the underlying external circuitry. Finally, the solder balls are re-melted and the mounted integrated circuit is "underfilled" using an electrically-insulating adhesive.

During the flip chip assembly process, the solder hardens at or about the same time as vaporized residual flux and its decomposition products deposit on various exposed surfaces. The flux residue should be removed from all critical surfaces prior to further operations on the integrated circuit assembly. A failure to sufficiently remove the flux residue can cause failure of the integrated circuit during long term use due to, for example, stress corrosion during exposure to a temperature and humidity environment.

BRIEF DESCRIPTION OF THE DRAWINGS

For a more complete understanding of the present invention, and the advantages thereof, reference is now made to the following descriptions taken in conjunction with the accompanying drawing, in which:

FIG. 3 is simplified schematic of an embodiment of a flux residue cleaning system suitable for cleaning the chip on wafer microbump assembly of FIG. 1;

FIG. 4 is a plan view of the chip on wafer microbump assembly of FIG. 1 after an outer region of flux residue has been removed by the flux residue cleaning system of FIG. 3;

FIG. 5 is a plan view of the chip on wafer microbump assembly of FIG. 1 after an inner region of flux residue has been removed by the flux residue cleaning system of FIG. 3;

FIG. 6 is simplified schematic of another embodiment of a flux residue cleaning system suitable for cleaning the chip on wafer microbump assembly of FIG. 1.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a flux residue cleaning system and method. The invention may also be applied, however, to cleaning systems and methods configured to remove other undesirable contaminants or substances from a circuit or electronic device.

Figure 1:
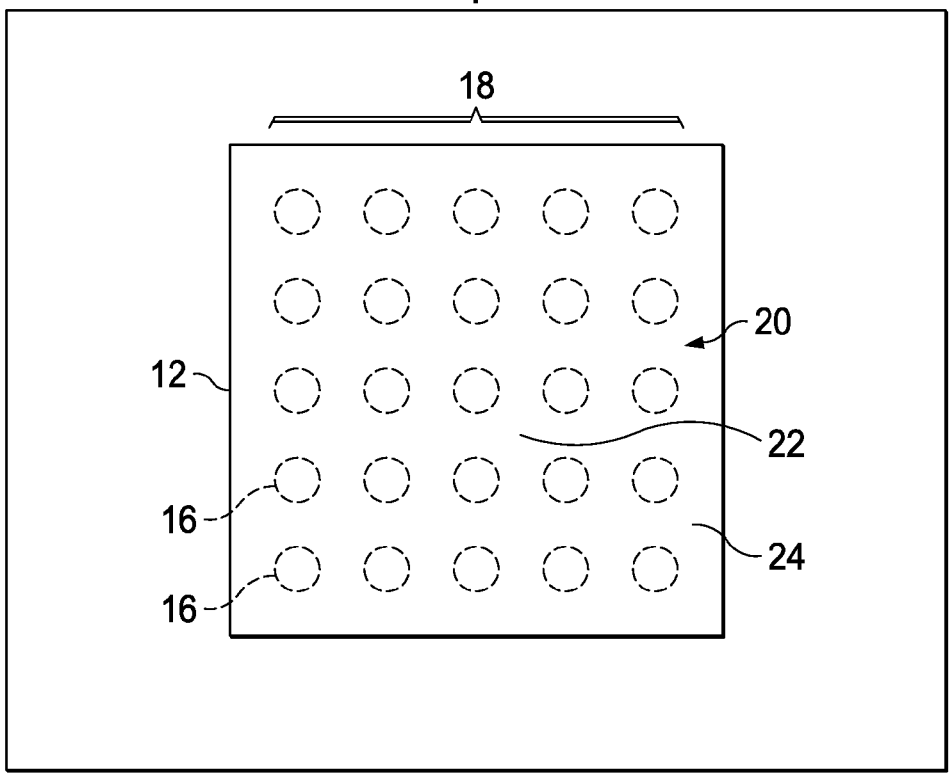
FIG. 1 is a plan view of a chip on wafer microbump assembly.
Figure 2:
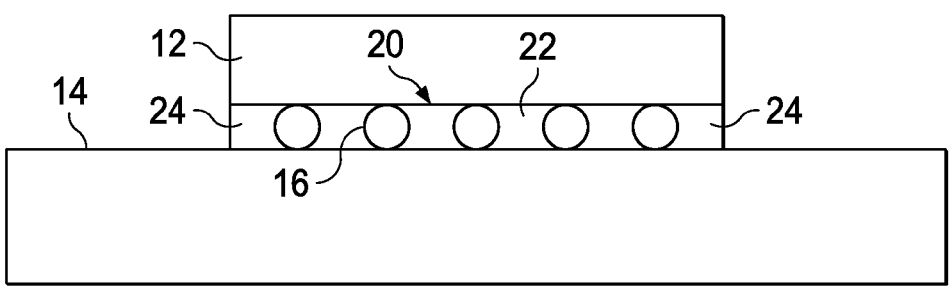
FIG. 2 is a cross section view, taken generally along line 2-2, of the chip on wafer microbump assembly of FIG. 1.

With reference now to FIGS. 1-2, a chip on wafer microbump assembly 10 is illustrated. The microbump assembly 10 includes a die 12 electrically coupled to a wafer 14 by microbumps 16 in a ball grid array 18. While not shown in FIG. 1, those skilled in the art will recognize that the wafer 14 actually supports a vast number of the die 12. However, for the purposes of illustration the wafer 14 of FIG. 1 includes only a single 12 forming one example of the microbump assembly 10. As shown, after a reflow of the microbumps 16 an undesirable flux residue 20 interposed between the wafer 14 and the die 12 of the microbump assembly 10 remains.

An inner region 22 of the flux residue 20, which is closest to the center of the die 12, is inaccessible to a conventional flux cleaning chemical or process. This is due to the small standoff and/or fine pitch afforded by the microbumps 16, the large size (i.e., surface area) of the die 12 included in the microbump assembly 10, and/or the outer region 24 of the flux residue 20, which is closest to an outer periphery of the die 12 and completely surrounds the inner region 22 of the flux residue 20. Indeed, the flux cleaning chemical or process, which initially only has access to an outer face of the outer region 24 of the flux residue 20, has to navigate between the wafer 14 and the die 12 and through the extremely small spaces found between adjacent microbumps 16 in an attempt to penetrate, soften, and/or remove the inner region 22 of flux residue 20. Unfortunately, such attempts often fail and sufficient standards of flux residue 20 removal are not met.

Referring now to FIG. 3, an embodiment of a flux residue cleaning system 26 is illustrated. The flux residue cleaning system 26 includes a first immersion chamber 28, a first spray chamber 30, a second immersion chamber 32, a second spray chamber 34, and a drying chamber 36.

The first immersion chamber 28 is configured to soften the outer region 24 of the flux residue 20 formed around microbumps 16 interposed between the wafer 14 and the die 12 when the wafer 14 is immersed in a first chemical 38. The first chemical 38 used in the first immersion chamber 28 may be like the solvent which will chemically react with and dissolve flux and it may also contain surfactant to physically carry flux out. The property of quite low surface tension is beneficial for the first chemical 38 to penetrate through region 24.

In some embodiments, the first immersion chamber 28 is equipped with a sonic wave apparatus 40 configured to propagate an ultrasonic wave or megasonic wave through the first chemical 38. Such propagation promotes the removal of the outer region 24 of flux residue 20. After being softened in first immersion chamber 28, flux residue is much easier to clean away during the next chemical spray procedure. The effect of flux residue softening may be enhanced by sonic wave apparatus 40. In some embodiments, the first immersion chamber 28 is configured to receive a plurality of the wafers 14 simultaneously.

The first spray chamber 30 is configured to remove the outer region 24 of the flux residue 20 when the wafer 14 is impinged upon by a first chemical spray 42. In some embodiments, the first chemical spray 42 may be a de-ionized water (DI), an isopropyl alcohol (IPA), or chemicals like the solvent which will chemically react with and dissolve flux. The first chemical spray 42 may also contain surfactant to physically carry flux out. The property of quite low surface tension is beneficial for the first chemical spray 42 to penetrate through region 24. In some embodiments, the wafer 14 is rotated 44 simultaneously as the first chemical spray 42 impinges the wafer 14.

As shown in FIG. 4, by removing the outer region 24 of the flux residue 20, the inner region 22 of the flux residue 20, which was previously surrounded by the outer region 24 and wholly inaccessible, is now exposed. Therefore, as will be more fully explained below, additional chemicals or processes are able to work directly upon the inner region 22 of the flux residue 20. As such, the negative effect that a large die 12 size has on conventional flux cleaning processes is mitigated or eliminated. Indeed, the inner region 22 of the flux residue 20 is now much smaller than the overlying die 12 and chemicals or processes need not penetrate into the chip on wafer microbump assembly 10 as far relative to when the entire mass of flux residue 20 was present.

In addition to the above, the remaining flux residue 20 of the inner region 22 now encompasses or surrounds fewer of the microbumps 16 relative to when the entire mass of flux residue 20 was present. So, the negative effect that a small standoff and a fine pitch have on conventional flux cleaning processes is also mitigated or eliminated.

Referring back to FIG. 3, the second immersion chamber 32 is configured to soften the inner region 22 of the flux residue 20 formed around the microbumps 16 interposed between the wafer 14 and the die 12 when the wafer is immersed in a second chemical 46. The second chemical 46 used in the second immersion chamber 32 may be like the solvent which will chemically react with and dissolve flux and it may also contain surfactant to physically carry flux out. The property of quite low surface tension is beneficial for the second chemical 46 to penetrate through region 22.

In some embodiments, the second chemical 46 used in the second immersion chamber 32 is the same the first chemical 38 used in the first immersion chamber 28. However, in another embodiment, the second chemical 46 used in the second immersion chamber 32 is different than the first chemical 38 used in the first immersion chamber 28. Indeed, the same chemicals can be repeatedly used or a variety of different chemicals can be used in the first and second immersion chambers 28, 32.

In some embodiments, the second immersion chamber 32 is equipped with a sonic wave apparatus 40 configured to propagate an ultrasonic wave or megasonic wave through the second chemical 46. Such propagation promotes the removal of the outer region 24 of flux residue 20. In some embodiments, the second immersion chamber 32 is configured to receive a plurality of the wafers 14 simultaneously. After being softened in first immersion chamber 32, flux residue is much easier to clean away during the next chemical spray procedure. The effect of flux residue softening may be enhanced by the sonic wave apparatus 40.

The second spray chamber 34 is configured to remove the inner region 22 of the flux residue 20 when the wafer is impinged upon by a second chemical spray 48 in order to clean the wafer 14. In some embodiments, the first chemical spray 42 may be a de-ionized water (DI), an isopropyl alcohol (IPA), or chemicals like the solvent which will chemically react with and dissolve flux. The first chemical spray may also contain surfactant to physically carry flux out. The property of quite low surface tension is beneficial for the first chemical spray 42 to penetrate through region 22. In some embodiments, the wafer 14 is rotated 44 simultaneously as the second chemical spray 48 impinges the wafer 14.

In some embodiments, the second chemical spray 48 used in the second spray chamber 34 is the same the first chemical spray 42 used in the first spray chamber 30. However, in another embodiment, the second chemical spray 48 used in the second spray chamber 34 is different than the first chemical spray 42 used in the first spray chamber 30. Indeed, the same chemicals can be repeatedly used or a variety of different chemicals can be used in the first and second spray chambers 30, 34.

As shown in FIG. 5, by removing the inner region 22 of the flux residue 20, the chip on wafer microbump assembly 10 is free, or substantially free, of the undesirable flux residue 20. As noted above, because the second chemical 46 in the second immersion chamber 32 and the second chemical spray 48 in the second spray chamber 34 were able to act directly upon the inner region of flux residue 20, which is substantially smaller in size than the entire mass of flux residue 20 that was initially present. Again, the negative effect that the large die 12 size, the small standoff, and/or the fine pitch have on conventional flux cleaning processes is mitigated or eliminated by the multi-step cleaning process afforded by the flux residue cleaning system 26 of FIG. 1.

In some embodiments, the wafer 14 as shown in FIG. 5 is cleaned to a predetermined standard, which entails the removal of about one hundred percent (100%) of the flux residue 20 from the chip on wafer microbump assembly 10.

After each of the wafers 14 has been through the first and second immersion chambers 28, 32 and the first and second spray chambers 30, 34 and a sufficient, desirable, or acceptable amount of the flux residue 20 has been removed from the microbump assembly 10, the wafers 14 are moved to a drying chamber 36. The drying chamber 36 is configured to dry the wafer 14 when the wafer 14 is exposed to a flow of nitrogen 50 and, in some embodiments, rotated 44.

Referring now to FIG. 6, another embodiment of a flux residue cleaning system 52 is illustrated. The flux residue cleaning system 52 includes a first immersion chamber 28, a plurality of first spray chambers 30, a second immersion chamber 32, a plurality of second spray chambers 34, and a drying chamber 36. As will be more fully explained below, because the overall spray cleaning time for a particular wafer 14 can be divided or shared between individual spray chambers in the plurality of first spray chambers 30 and again in the plurality of second spray chambers 34, the wafer per hour metric is increased. Indeed, any bottleneck experienced or created when a lone spray chamber is used, which results in a low wafer per hour count, is mitigated or eliminated.

With the exception of the additional first and second spray chambers 34, the flux residue cleaning system 26 of FIG. 6 is generally the same or similar to the flux cleaning system 26 of FIG. 3. Therefore, like reference numbers have been used and further detailed description of like elements has been omitted.

Still referring to FIG. 6, the plurality of first spray chambers 30 is configured to collectively remove the outer region 24 of the flux residue 20 when the wafer 14 is impinged upon by the first chemical spray 42 and, in some embodiments, rotated 44. In other words, one of the first spray chambers 30 is configured to remove a portion of the outer region 24 of the flux residue 20 when the wafer 14 is impinged upon by the first chemical spray 42 and an additional one of the first spray chambers 30 is configured to remove a further portion of the outer region 24 of the flux residue 20 when the wafer 14 is impinged upon by the first chemical spray 42 in order to expose an inner region 22 of the flux residue 20. In some embodiments the wafer 14 may be rotated 44 during or after impingement with the first chemical spray 42.

In some embodiments, the first chemical spray 42 is the same in each of the plurality of first spray chambers 30. However, in other embodiments different first chemical sprays 42 may be used in different first spray chambers 30.

Indeed, the same chemicals can be repeatedly used or a variety of different chemicals can be used in the plurality of first spray chambers 30.

The plurality of second spray chambers 34 is configured to collectively remove the inner region 22 of the flux residue 20 when the wafer 14 is impinged upon by the second chemical spray 48. In other words, one of the second spray chambers 34 is configured to remove a portion of the inner region 22 of the flux residue 20 when the wafer 14 is impinged upon by the second chemical spray 48 and an additional one of the second spray chambers 34 is configured to remove a further portion of the inner region 22 of the flux residue 20 when the wafer 14 is impinged upon by the second chemical spray 48 in order to clean the wafer 14. In some embodiments the wafer 14 may be rotated 44 during or after impingement with the second chemical spray 48.

In some embodiments, the second chemical spray 48 is the same in each of the plurality of second spray chambers 34. However, in other embodiments different second chemical sprays 48 may be used in different second spray chambers 34. Indeed, the same chemicals can be repeatedly used or a variety of different chemicals can be used in the plurality of second spray chambers 34. Moreover, despite two of the first spray chambers 30 and two of the second spray chambers 34 being illustrated in FIG. 6, additional first and second spray chambers may be included in the flux residue cleaning system 52.

Figure 7:
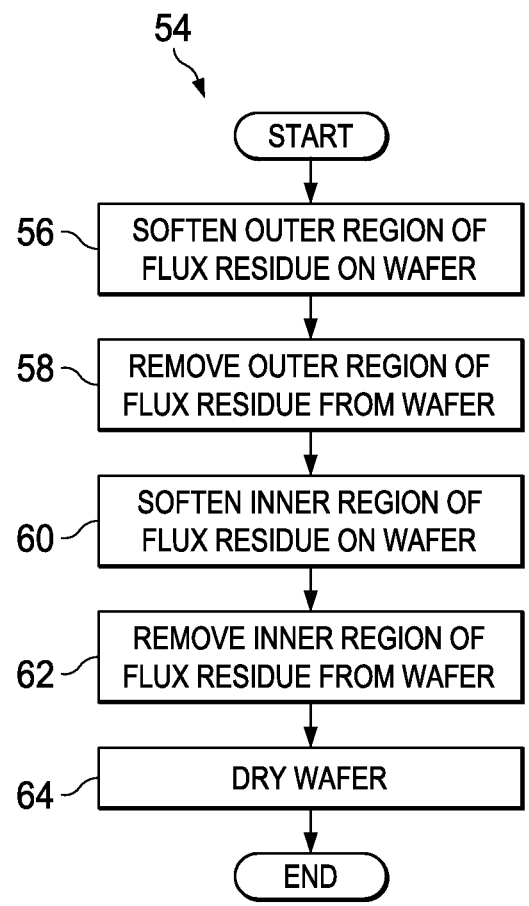
FIG. 7 is a flowchart of a method of cleaning flux residue 20 from the chip on wafer microbump assembly of FIG. 1.

Referring now to FIG. 7, a method 54 of cleaning flux residue 20 formed around the microbumps 16 interposed between the wafer and the die 12 is illustrated. In block 56, an outer region 24 of the flux residue 20 formed around the microbumps 16 interposed between the wafer 14 and the die 12 are softened by immersing the wafer 14 in the first chemical in the first immersion chamber 28. In some embodiments, in addition to being immersed in the first chemical, the wafer 14 is also agitated while in the first immersion chamber 28.

In block 58, the outer region 24 of the flux residue 20 is removed by impinging the first chemical spray 42 upon and/or rotating 44 the wafer 14 in the first spray chamber 30. This exposes the inner region 22 of the flux residue 20.

In block 60, the inner region 22 of the flux residue 20 formed around the microbumps 16 interposed between the wafer 14 and the die 12 is softened by immersing the wafer 14 in the second chemical 46 in the second immersion chamber 32. In some embodiments, in addition to being immersed in the second chemical 46, the wafer 14 is also agitated while in the second immersion chamber 32.

In some embodiments, the step of softening the inner region 22 of the flux residue is performed on a plurality of the wafers 14 simultaneously. Likewise, in some embodiments the step of softening the outer region 24 of the flux residue 20 is also performed on a plurality of the wafers 14 simultaneously.

In block 62, the inner region 22 of the flux residue 20 is removed by impinging the second chemical spray 48 upon and/or rotating 44 the wafer 14 in the second spray chamber 34 in order to clean the wafer 14. In some embodiments, the wafer 14 is cleaned to a predetermined standard, which entails the removal of about one hundred percent (100%) of the flux residue 20 from the chip on wafer microbump assembly 10. Finally, in block 64, the wafer 14 is dried by exposing the wafer 14 to a flow of nitrogen 50 and rotating 44 the wafer 14 in the drying chamber.

From the foregoing disclosure, those skilled in the art will now recognize that the flux residue cleaning apparatuses 26, 52 and method 54 provide several advantages. By way of example, a conventional single-step flux residue removal system might have an immersion chamber that occupies twenty minutes, a spray chamber occupies thirty minutes, and a drying chamber that occupies two minutes. As such, the wafer per hour (WPH) throughput is about two because of the bottleneck created by the thirty minutes the wafer spent in the spray chamber.

In contrast, with the flux residue cleaning system 26 of FIG. 3, if the first immersion chamber 28 occupies ten minutes, the first spray chamber 30 occupies fifteen minutes, the second immersion chamber 32 occupies ten minutes, the second spray chamber 34 occupies fifteen minutes, and the drying chamber 36 occupies about 2 minutes, the WPH throughput is about four because the spray chamber time has been reduced to fifteen minutes. Moreover, because the cleaning effect is significantly improved using a multi-step process where immersion chamber times and spray chamber times are divided among different chambers as illustrated in FIGS. 3 and 6, the overall immersion and/or spray times may be able to be reduced, thus further improving the WPH to something greater than four.

A flux residue cleaning system comprising a first immersion chamber configured to soften an outer region of a flux residue formed around microbumps interposed between a wafer and a die when the wafer is immersed in a first chemical, a first spray chamber configured to remove the outer region of the flux residue when the wafer is impinged upon by a first chemical spray and rotated in order to expose an inner region of the flux residue, a second immersion chamber configured to soften the inner region of the flux residue formed around the microbumps interposed between the wafer and the die when the wafer is immersed in a second chemical, a second spray chamber configured to remove the inner region of the flux residue when the wafer is impinged upon by a second chemical spray and rotated in order to clean the wafer; and a drying chamber configured to dry the wafer when the wafer is exposed to a flow of nitrogen and rotated.

A flux residue cleaning system comprising a first immersion chamber configured to soften an outer region of a flux residue formed around microbumps interposed between a wafer and a die when the wafer is immersed in a first chemical, a first spray chamber configured to remove a portion of the outer region of the flux residue when the wafer is impinged upon by a first chemical spray and rotated, an additional first spray chamber configured to remove a further portion of the outer region of the flux residue when the wafer is impinged upon by an additional first chemical spray and rotated in order to expose an inner region of the flux residue, a second immersion chamber configured to soften the inner region of the flux residue formed around the microbumps interposed between the wafer and the die when the wafer is immersed in a second chemical, a second spray chamber configured to remove a portion of the inner region of the flux residue when the wafer is impinged upon by a second chemical spray and rotated, an additional second spray chamber configured to remove a further portion of the inner region of the flux residue when the wafer is impinged upon by an additional second chemical spray and rotated in order to clean the wafer, and a drying chamber configured to dry the wafer when the wafer is exposed to a flow of nitrogen and rotated.

A method of cleaning flux residue formed around microbumps interposed between a wafer and a die comprising softening an outer region of a flux residue formed around microbumps interposed between a wafer and a die by immersing the wafer in a first chemical in the first immersion chamber, removing the outer region of the flux residue by impinging a first chemical spray upon and rotating the wafer in a first spray chamber to expose an inner region of the flux residue, softening the inner region of the flux residue formed around microbumps interposed between the wafer and the die by immersing the wafer in a second chemical in the second immersion chamber, removing the inner region of the flux residue by impinging a second chemical spray upon and rotating the wafer in a second spray chamber in order to clean the wafer, and dry the wafer by exposing the wafer to a flow of nitrogen and rotating the wafer in the drying chamber.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A flux residue cleaning system, comprising:
    a first immersion chamber configured to receive a wafer, the first immersion chamber adapted to soften an outer region of a flux residue formed around microbumps interposed between the wafer and a die when the wafer is immersed in a first chemical;
    a first spray chamber adapted to receive the wafer from the first immersion chamber, the first spray chamber comprising a first sprayer, the first sprayer discharging a first chemical spray towards the wafer, the first chemical spray impinging on the flux residue to remove the outer region of the flux residue in order to expose an inner region of the flux residue;
    a second immersion chamber adapted to receive the wafer from the first spray chamber, the second immersion chamber adapted to soften the inner region of the flux residue when the wafer is immersed in a second chemical;
    a second spray chamber adapted to receive the wafer from the second immersion chamber, the second spray chamber comprising a second sprayer, the second sprayer discharging a second chemical spray towards the wafer, the second chemical spray impinging on the flux residue to remove the inner region of the flux residue in order to clean the wafer; and
    a drying chamber adapted to receive the wafer from the second spray chamber, the drying chamber adapted to dry the wafer when the wafer is exposed to a flow of nitrogen;
    wherein:
        the second immersion chamber is different than the first immersion chamber;
        the second spray chamber is different than the first spray chamber;
        the first chemical spray comprises de-ionized (DI) water; and
        the second chemical spray comprises at least one of DI water and isopropyl alcohol.

2. The flux residue cleaning system of claim 1, wherein the first immersion chamber is equipped with a first sonic wave apparatus configured to propagate at least one of an ultrasonic wave or a megasonic wave in the first chemical to promote removal of the outer region of the flux residue.

3. The flux residue cleaning system of claim 1, wherein the second immersion chamber is equipped with a second sonic wave apparatus configured to propagate at least one of an ultrasonic wave or a megasonic wave in the second chemical to promote removal of the inner region of the flux residue.

4. The flux residue cleaning system of claim 1, wherein the first and second immersion chambers are each equipped with a sonic wave apparatus.

5. The flux residue cleaning system of claim 1, wherein the first immersion chamber is configured to receive a plurality of the wafers simultaneously.

6. The flux residue cleaning system of claim 1, wherein the second immersion chamber is configured to receive a plurality of the wafers simultaneously.

7. The flux residue cleaning system of claim 1, wherein each of the first and second immersion chambers is configured to receive a plurality of the wafers simultaneously.

8. The flux residue cleaning system of claim 1, further comprising a third spray chamber having a third sprayer, the third sprayer discharging a third chemical spray towards the wafer, the third chemical spray impinging on the flux residue to remove a portion of the outer region of the flux residue.

9. The flux residue cleaning system of claim 8, further comprising a fourth spray chamber having a fourth sprayer, the fourth sprayer discharging a fourth chemical spray towards the wafer, the fourth chemical spray impinging on the flux residue to remove a portion of the inner region of the flux residue.

10. A flux residue cleaning system, comprising:
    a first immersion chamber configured to soften an outer region of a flux residue formed around microbumps interposed between a wafer and a die when the wafer is immersed in a first chemical;
    a first spray chamber configured to receive the wafer from the first immersion chamber, the first spray chamber comprising a first sprayer, the first sprayer directing drops of a first chemical spray towards the wafer, the drops of the first chemical spray impinging on the flux residue to remove a portion of the outer region of the flux residue;
    an additional first spray chamber configured to receive the wafer from the first spray chamber, the additional first spray chamber comprising an additional first sprayer, the additional first sprayer directing drops of an additional first chemical spray towards the wafer, the drops of the additional first chemical spray impinging on the flux residue to remove a further portion of the outer region of the flux residue in order to expose an inner region of the flux residue;
    a second immersion chamber configured to receive the wafer from the additional first spray chamber, the second immersion chamber adapted to soften the inner region of the flux residue when the wafer is immersed in a second chemical;
    a second spray chamber configured to receive the wafer from the second immersion chamber, the second spray chamber comprising a second sprayer, the second sprayer directing drops of a second chemical spray towards the wafer, the drops of the second chemical spray impinging on the flux residue to remove a portion of the inner region of the flux residue;
    an additional second spray chamber configured to receive the wafer from the second spray chamber, the additional second spray chamber comprising an additional second sprayer, the additional second sprayer directing drops of an additional second chemical spray towards the wafer, the drops of the additional second chemical spray impinging on the flux residue to remove a further portion of the inner region of the flux residue in order to clean the wafer;

a drying chamber configured to receive the wafer from the additional second spray chamber, the drying chamber adapted to dry the wafer when the wafer is exposed to a flow of nitrogen;

wherein:

the second chemical spray comprises de-ionized (DI) water; and the first chemical spray comprises at least one of DI water and isopropyl alcohol.

11. The flux residue cleaning system of claim 10, wherein the first immersion chamber is equipped with a first sonic wave apparatus configured to propagate at least one of an ultrasonic wave or a megasonic wave in the first chemical to promote removal of the outer region of the flux residue.

12. The flux residue cleaning system of claim 10, wherein the second immersion chamber is equipped with a second sonic wave apparatus configured to propagate at least one of an ultrasonic wave or a megasonic wave in the second chemical to promote removal of the inner region of the flux residue.

13. The flux residue cleaning system of claim 10, wherein the first and second immersion chambers are each equipped with a sonic wave apparatus.

14. The flux residue cleaning system of claim 10, wherein the first immersion chamber is configured to receive a plurality of the wafers simultaneously.

15. The flux residue cleaning system of claim 10, wherein the second immersion chamber is configured to receive a plurality of the wafers simultaneously.

16. The flux residue cleaning system of claim 10, wherein each of the first and second immersion chambers is configured to receive a plurality of the wafers simultaneously.

17. A cleaning system comprising:

a first immersion chamber comprising a first chemical;

a first spray chamber adapted to receive a wafer from the first immersion chamber, the first spray chamber comprising:

a first sprayer configured to discharge a first chemical spray towards the wafer to remove an outer region of a flux residue formed around connectors interposed between the wafer and a die when the first chemical spray impinges the flux residue; and a first rotating wafer support configured to rotate the wafer while the first chemical spray impinges the flux residue;

a second immersion chamber adapted to receive the wafer from the first spray chamber, the second immersion chamber comprising a second chemical;

a second spray chamber adapted to receive the wafer from the second immersion chamber, the second spray chamber comprising:

a second sprayer configured to discharge a second chemical spray towards the wafer to remove an inner region of the flux residue when the second chemical spray impinges the flux residue, the inner region of the flux residue being surrounded by the outer region of the flux residue; and a second rotating wafer support configured to rotate the wafer while the second chemical spray impinges the flux residue; and wherein, at least one of the first chemical spray and the second chemical spray comprises de-ionized (DI) water and isopropyl alcohol.

18. The cleaning system of claim 17, wherein the first immersion chamber is configured to soften the outer region of the flux residue when the wafer is immersed in the first chemical, and wherein the second immersion chamber is configured to soften the inner region of the flux residue when the wafer is immersed in the second chemical.

19. The cleaning system of claim 17 further comprising a drying chamber configured to dry the wafer when the wafer is exposed to a flow of nitrogen.

20. The cleaning system of claim 17, wherein the first and second immersion chambers are each equipped with a sonic wave apparatus.

* * * * *